United States Patent [19]

Henderson

[11] 4,422,096
[45] Dec. 20, 1983

[54] TELEVISION FREQUENCY SYNTHESIZER FOR NONSTANDARD FREQUENCY CARRIERS

[75] Inventor: John G. N. Henderson, Princeton, N.J.

[73] Assignee: RCA Corporation, New York, N.Y.

[21] Appl. No.: 751,924

[22] Filed: Dec. 16, 1976

Related U.S. Application Data

[63] Continuation of Ser. No. 632,060, Nov. 14, 1975, abandoned.

[51] Int. Cl.³ .................. H04N 5/44; H04N 5/50; H04B 1/26
[52] U.S. Cl. .................. 358/191.1; 358/195.1; 455/182; 455/183
[58] Field of Search .................. 325/418–421, 325/423, 308, 453, 459, 457, 460, 461, 464, 465, 468, 470, 471; 358/86, 191, 193; 334/14–16; 331/14, 16, 18

[56] References Cited

U.S. PATENT DOCUMENTS

| | | |
|---|---|---|
| 3,713,040 | 1/1973 | Page, Jr. .................. 331/1 A |
| 3,803,494 | 4/1974 | Howell et al. |
| 3,864,637 | 2/1975 | Kanow . |
| 3,922,609 | 11/1975 | Grohmann . |
| 3,980,951 | 9/1976 | Breeze . |
| 4,009,438 | 11/1977 | Grohmann . |
| 4,009,439 | 2/1977 | Rast .................. 325/421 |
| 4,024,476 | 5/1977 | Briggs .................. 325/421 |
| 4,031,549 | 6/1977 | Rast .................. 325/419 X |
| 4,038,689 | 7/1977 | Rzeszewski et al. .................. 358/191 |
| 4,041,535 | 8/1977 | Rzeszewski et al. .................. 358/191 |

FOREIGN PATENT DOCUMENTS

| | | |
|---|---|---|
| 2211664 | 9/1973 | Fed. Rep. of Germany . |
| 2217002 | 10/1973 | Fed. Rep. of Germany . |
| 2333851 | 1/1975 | Fed. Rep. of Germany . |
| 2631039 | 1/1977 | Fed. Rep. of Germany . |
| 2236318 | 1/1975 | France . |
| 548694 | 4/1974 | Switzerland . |
| 1372576 | 10/1974 | United Kingdom . |
| 1377100 | 12/1974 | United Kingdom . |
| 1389071 | 4/1975 | United Kingdom . |
| 1395768 | 5/1975 | United Kingdom . |
| 1410363 | 10/1975 | United Kingdom . |

Primary Examiner—Aristotelis M. Psitos
Attorney, Agent, or Firm—E. M. Whitacre; P. J. Rasmussen; P. M. Emanuel

[57] ABSTRACT

In a phase locked loop (PLL) tuning system for a television receiver, the capability of tuning channels with RF signals with non-standard frequencies arbitrarily near the respective standard frequencies is provided by making a frequency divider used in the PLL for establishing the frequency relationship of the local oscillator signal to the crystal oscillator signal controllable in a limited range corresponding to a frequency range less than the frequency separation between channels. As one feature of this system the divider is controlled in accordance with predetermined AFT signal conditions. As another feature, the division factor of the divider is initially offset from its nominal value corresponding to the standard frequency for the selected channel and thereafter the frequency of the local oscillator signal is controlled in response to the AFT signal.

29 Claims, 6 Drawing Figures

Fig. 6.

| CHANNEL | | N SCAN. & NON-SCAN. | R NON-SCAN. | SCANNING MODE | | | | | | |
|---|---|---|---|---|---|---|---|---|---|---|
| | | | | START R | STOP R | ΔR | $f_{LO}$ START (MHz) | $f_{LO}$ STOP (MHz) | $\Delta f_{LO}$ (kHz) |
| LOW VHF | 2 | 101 | 1280 | 1250 | 1304 | 2 | 103.42 | 99.14 | 158 |
| | 3 | 107 | " | " | " | " | 109.57 | 105.03 | 167 |
| | 4 | 113 | " | " | " | " | 115.71 | 110.92 | 176 |
| | 5 | 123 | " | " | " | " | 125.95 | 120.74 | 192 |
| | 6 | 129 | " | " | " | " | 132.10 | 126.63 | 201 |
| HIGH VHF | 7 | 221 | " | 1266 | 1292 | " | 223.44 | 218.95 | 345 |
| | 8 | 227 | " | " | " | " | 229.51 | 224.89 | 354 |
| | 9 | 233 | " | " | " | " | 235.58 | 230.84 | 364 |
| | 10 | 239 | " | " | " | " | 241.64 | 236.78 | 373 |
| | 11 | 245 | " | " | " | " | 247.71 | 242.72 | 382 |
| | 12 | 251 | " | " | " | " | 253.78 | 248.67 | 392 |
| | 13 | 257 | " | " | " | " | 259.84 | 254.61 | 401 |
| UHF | 14 | 517 | " | N.A. | N.A. | N.A. | N.A. | N.A. | N.A. |
| | 15 | 523 | " | " | " | " | " | " | " |
| | 16 | 529 | " | " | " | " | " | " | " |
| | ... | ... | ... | ... | ... | ... | ... | ... | ... |
| | 83 | 931 | " | " | " | " | " | " | " |

TELEVISION FREQUENCY SYNTHESIZER FOR NONSTANDARD FREQUENCY CARRIERS

This is a continuation of application Ser. No. 632,060, filed Nov. 14, 1975 now abandoned.

The present invention is directed to television channel tuning apparatus and is particularly directed to such apparatus including a frequency synthesizer.

In the United States, television over the air broadcast carrier frequencies for VHF (very high frequency) and UHF (ultra high frequency) channels are allocated by the Federal Communications Commission (FCC). During over the air broadcast transmission, these frequencies are required to be maintained to a high degree of accuracy.

Recently, frequency synthesizers including a phase locked loop (PLL) have been suggested to accurately generate local oscillator signals at predetermined frequencies corresponding to the various channels which a viewer may select. For example, a tuning apparatus utilizing a phase locked loop is described in the Digital Integrated Circuits Application Note ICAN-6716 entitled "Low-Power Digital Frequency Synthesizer Utilizing COS/MOS IC's" by R. E. Funk appearing in the 1972 RCA Solid State Databook on COS/MOS Digital Integrated Circuits (SSD-203) published by the RCA Corporation.

Other types of systems are also known for tuning a television receiver to standard frequencies. In one type, described in U.S. Pat. No. 3,818,353 entitled "Automatic Tuning Apparatus Having Dual Frequency Sweep" by Sakamoto, issued June 18, 1974, the system includes two oscillators which are swept alternately and in a stepwise manner from a preliminary frequency over the range of over the air broadcast channel local oscillator frequencies. By counting the number of times that sweeping and stopping of the oscillators occurs, it is possible to determine when a preliminary local oscillator control voltage close to but slightly less than the control voltage which is proper for tuning to a particular channel has been reached. Thereafter, an auxiliary sweep circuit increases the control voltage to the proper tuning voltage.

Tuning apparatus of the frequency synthesizer type for standard frequency broadcast carriers is thus known. However, not all television signals are transmitted on standard over the air broadcast carriers. In some television distribution systems, such as in apartment house and motel installations, television signals are coupled to the receivers through cables. In these and other systems employing cable (or even microwave links), the modulated broadcast carrier may be demodulated and then remodulated on to a different carrier arbitrarily near the standard broadcast carrier before coupling to a receiver. It is therefore desirable to provide apparatus for tuning receivers to such nonstandard carriers.

In accordance with the present invention, apparatus which may be utilized for tuning a television receiver to both standard frequency carriers associated with conventional VHF and UHF channels and nonstandard carriers located arbitrarily near the standard frequency carriers is provided. Controlled oscillator means are included in the tuning apparatus for generating a local oscillator signal. Mixer means combine the local oscillator signal and a modulated receiver carrier to derive a modulated intermediate frequency carrier. Programmable divider means divide the frequency of the local oscillator signal by a first number corresponding to a presently selected channel. Phase detector means provide a first control signal for maintaining the frequency divided local oscillator signal and a reference frequency signal in predetermined phase and frequency relationship. The first control signal has an amplitude range between first and second amplitudes sufficient to vary the local oscillator signal over a frequency range in excess of adjacent channel spacing.

Frequency discriminator means generate a discriminator signal representing the frequency deviation of the intermediate frequency carrier from a fixed frequency (e.g., the nominal frequency of the picture carrier). The discriminator signal has an amplitude range between minimum and maximum amplitudes corresponding to frequency deviations which are a fraction of the frequency spacing between channels. Means coupled to the discriminator means derive a second control signal from the discriminator signal. The second control signal has an amplitude range between first and second amplitudes which are substantially the same as the first and second amplitudes of the first control signal and which correspond to frequency deviations of said intermediate frequency carrier between those deviations associated with said maximum and minimum amplitudes of the discriminator signal.

Scanning means cause the local oscillator signals to be scanned in a frequency range in the vicinity of the frequency of a selected local oscillator signal. The frequency of the local oscillator signal may be scanned, for example, by incrementing the frequency of the reference frequency signal with respect to the frequency divided local oscillator signal. Means are provided for disabling the scanning means when the deviation between the frequency of the intermediate frequency carrier and the fixed frequency is within a predetermined range and when the amplitude of the control signal substantially equals the amplitude of the first control signal for the presently selected channel.

Switch means are provided for selectively coupling the first and second control signals to the controlled oscillator means. When the scanning means are disabled, the switch means decouples the first control signal from the controlled oscillator means and instead couples the second control signal to the controlled oscillator means. Thereafter, the second control signal controls the frequency of the local oscillator signal.

These and other aspects of the present invention may best be understood by the following detailed description and accompanying drawing in which:

FIG. 6 shows a table useful in understanding the operation of the tuning apparatus shown in FIG. 1.

Figure 1:
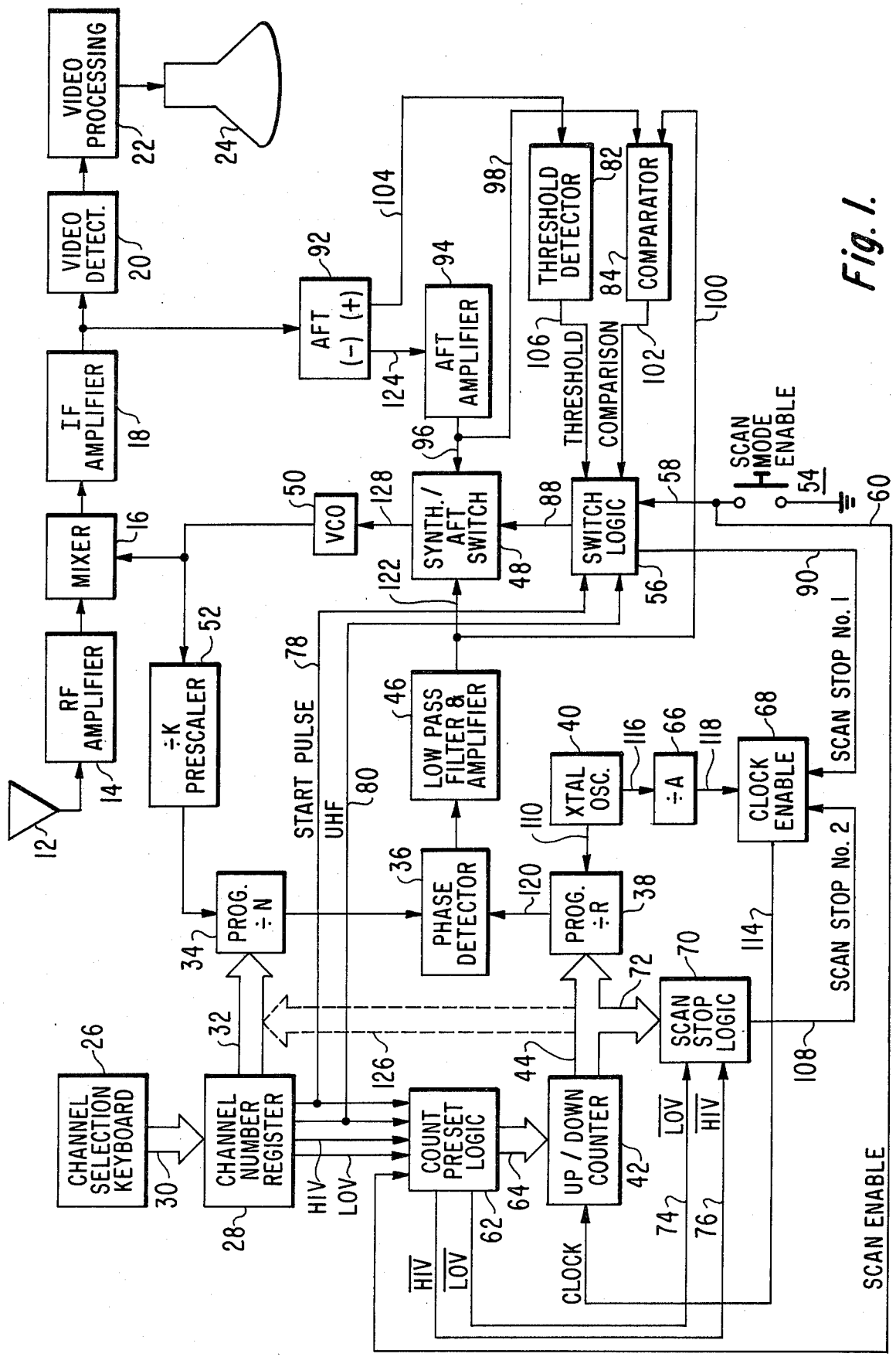
FIG. 1 shows, in block diagram form, a channel tuning apparatus constructed in accordance with the present invention employed in a television receiver.

In FIG. 1 the general arrangement of a television receiver is shown which employs a channel tuning apparatus constructed in accordance with the present invention. Radio frequencies (RF) are received by an antenna 12 and are amplified by a radio frequency amplifier 14. The amplified RF signals are coupled to a mixer 16 where they are combined with a local oscillator signal of the appropriate frequency, derived in accordance with a selected channel as will be subsequently described, to form an intermediate frequency (IF) signal. The IF signals are amplified by an IF amplifier 18 and thereafter are coupled to a video detector 20. Video detector 20 extracts video signals comprising, for example, chrominance, luminance and synchronizing signal components, from the amplified IF signals. The video signals are coupled to a video processing unit 22 including, for example, channels for processing the chrominance, luminance and synchronizing signal components of the video signal to form an image on a kinescope 24.

The general arrangement thus far described may employ the components utilized in a color television receiver of the CTC-68 type shown, for example, in RCA Color Television Service Data, FILE 1974 C-5, published by the RCA Corporation, Indianapolis, Ind.

In the illustrated apparatus, channel selection information is entered by a viewer through a channel selection keyboard 26. Keyboard 26 comprises, for example, a calculator type keyboard by which VHF or UHF channels may be selected in decimal format. Keyboard 26 may include, for example, a matrix circuit for converting the decimal information to binary coded decimal (BCD) format. The binary coded signals representing channel information are coupled to a channel number register 28 via a multiple conductor path 30.

Register 28 converts the binary channel selection information into other binary signals representing a number "N" corresponding to the presently selected channel. For this purpose, register 28 may, for example, include a read only memory (ROM) in which the "N" number information is stored for later retrieval in response to entry of the binary signals from keyboard 26.

The binary signals representing the number N are coupled via a multiple conductor path 32 to a programmable frequency divider 34 which is arranged to divide the frequency of incoming signals by the number N. Divider 34 is arranged in a phase-locked loop (PLL) configuration along with a voltage controlled local oscillator 50, a prescaler frequency divider 52, a crystal reference oscillator 40, a programmable divider by "R" circuit 38, a phase detector 36 and a low pass filter amplifier 46. The phase-locked loop arrangement in combination with the channel selection apparatus forms a frequency synthesizer of the type described in the above-mentioned RCA Application Note and is suitable for tuning a television receiver to standard frequency carriers.

Figure 2:
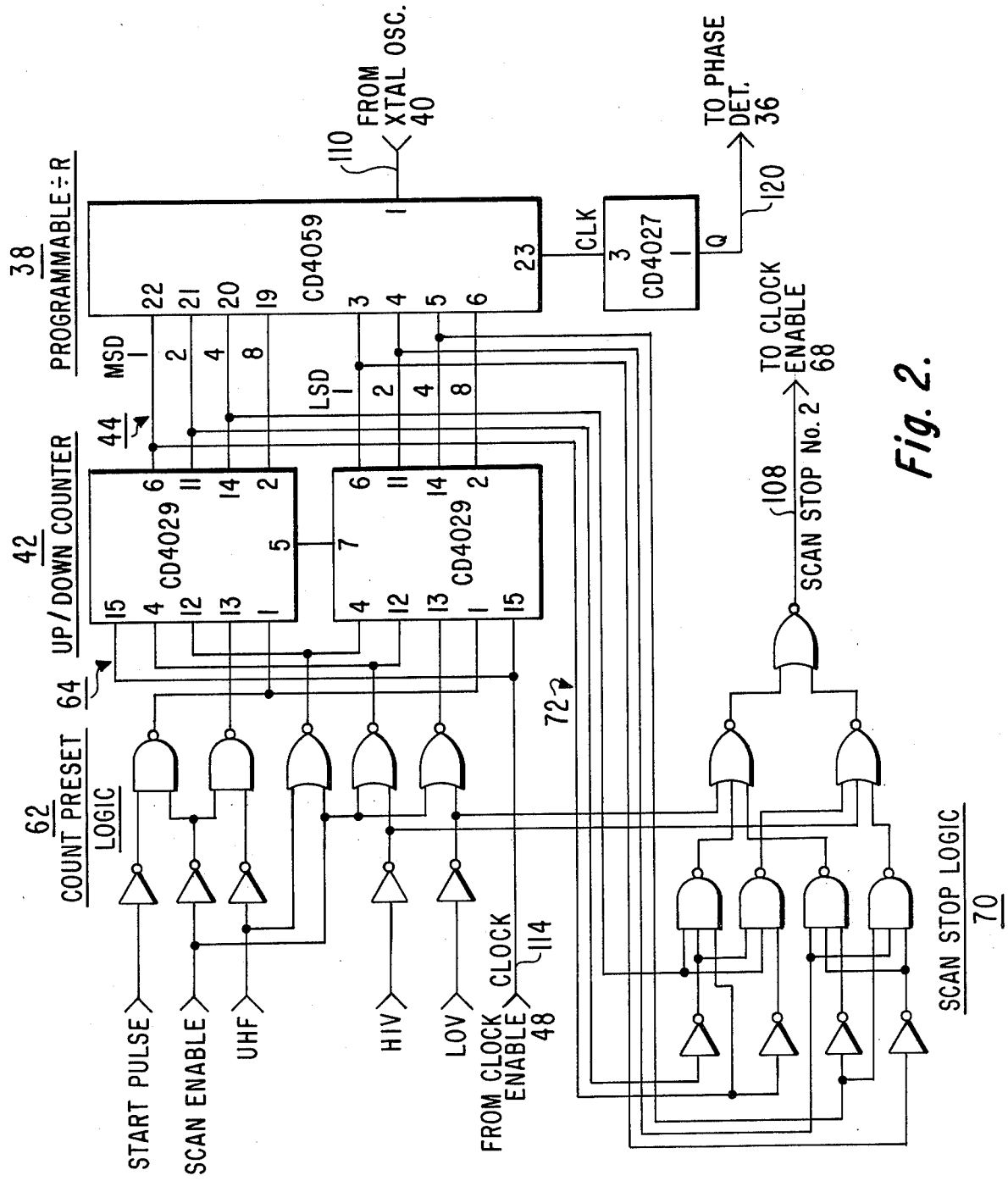
FIG. 2 shows a logic diagram of implementations of a portion of the tuning apparatus shown in FIG. 1.
Figure 3:
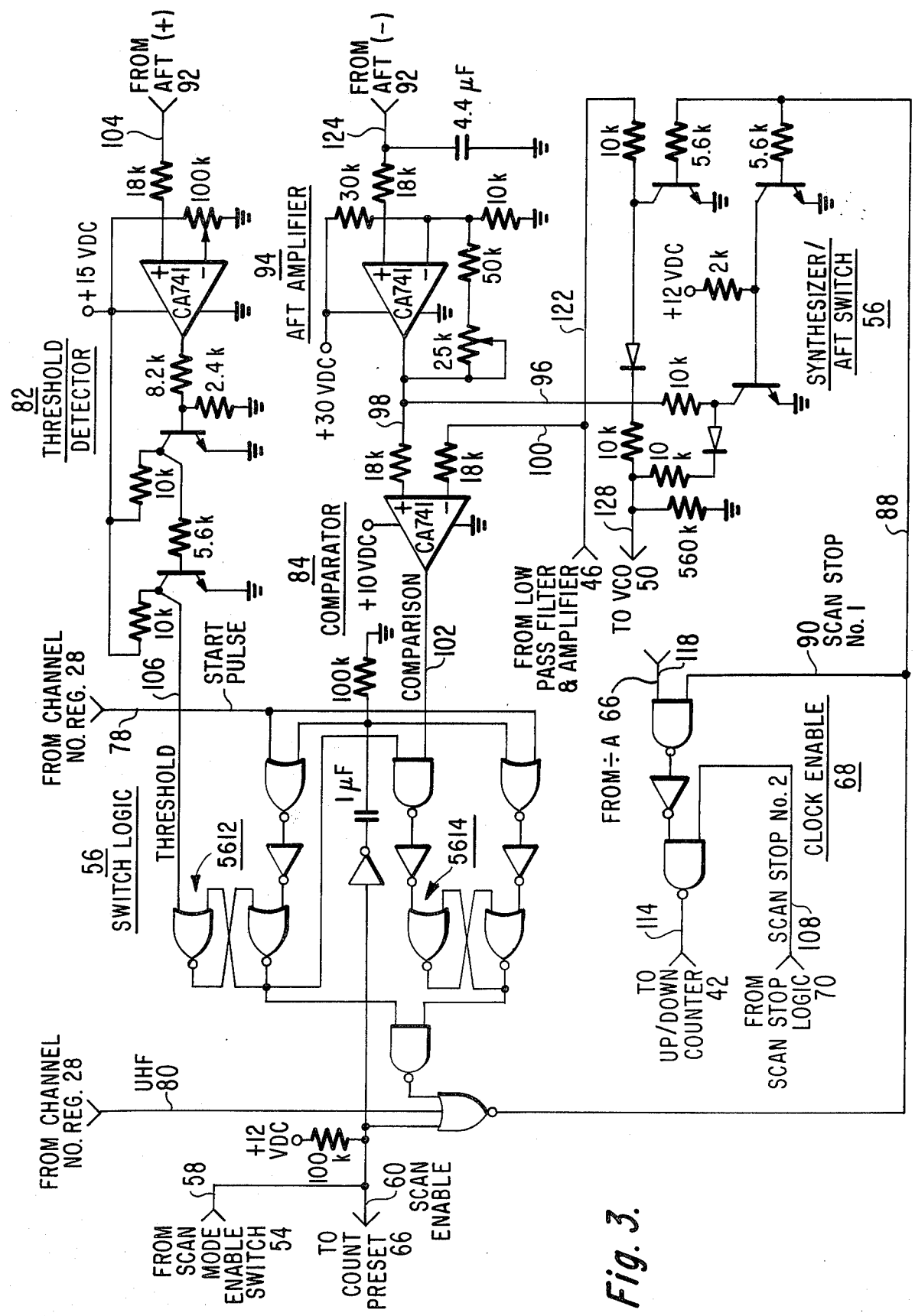
FIG. 3 shows, partially in schematic form and partially in logic diagram form, implementations of other portions of the tuning apparatus shown in FIG. 1.

The majority of the remainder of the block diagram shown in FIG. 1 is directed to apparatus for automatically tuning the receiver to nonstandard frequency carriers such as may be encountered, for example, in CATV and MATV systems. More detailed logic and block diagram for such apparatus are shown in FIGS. 2 and 3. However, a detailed description of the implementations shown in FIGS. 2 and 3 will not be given because such implementations will readily be understood by one skilled in the art from the following description of the tuning apparatus of the receiver of FIG. 1. For this purpose, portions of the implementations shown in FIGS. 2 and 3 and their interconnections have been identified by the same reference designation by which they are identified in FIG. 1. Also, for the purpose of relating the implementations of FIGS. 2 and 3 to FIG. 1, in the following description of FIG. 1, reference is made to logic "0" and "1" signals related to control signals associated with the tuning apparatus. These logic "0" and "1" signals correspond respectively to voltages near ground and approximately +12 vdc in the logic circuits of FIGS. 2 and 3, which may, for example, be formed of COS/MOS integrated circuits utilizing such voltages.

The tuning apparatus of the television receiver of FIG. 1 operates in two modes. In a first or non-scanning mode, that is, for the reception of a standard frequency carrier allocated to a selected channel, programmable ÷N divider 34 and programmable ÷R divider 38 are set respectively to predetermined values.

In the nonscanning mode of operation utilized for tuning the receiver to standard frequency carriers, a scan mode disable switch 54, operable by the viewer, is placed in its open position (as shown) so that a $\overline{\text{SCAN ENABLE}}$ control signal (a logic "1" representing the absence or compliment of a SCAN ENABLE control signal) is coupled to a switch logic unit 56 via a conductor 58 and to a count preset logic unit 62 via a conductor 60 to disable apparatus associated with receiving non-standard carriers in the manner to be explained below.

In response to the $\overline{\text{SCAN ENABLE}}$ control signal, switch logic unit 56 generates a STOP SCAN #1 control signal (a logic "0") which is coupled to a clock enable unit 68 via a conductor 90 to prevent clock pulses from a ÷A divider 66 from reaching the clock input (at conductor 114) of an up/down counter 42. As a result, counter 42 will not change the ÷R number of divider 38 as it does in the scanning mode to be subsequently discussed.

In either mode of operation, a viewer selects a channel by depressing or otherwise activating appropriate keys on channel selection keyboard 26. Channel number register 28 receives binary signals representing the channel selection information from keyboard 26 and extracts from its memory binary signals representing the number N corresponding to the channel selected. The binary information representing the number N is entered in programmable divide by N divider 34 so that it will divide the frequency of incoming signals by the number N.

In addition to extracting from its memory binary signals representing the number N whenever a new channel is selected, whether in the nonscanning or scanning mode, channel number register 28 also provides the START PULSE control signal (a logic "1") which is coupled to a switch logic unit 56 via a conductor 78, to reset flip-flops 5612 and 5614 (shown in FIG. 3) whose function will subsequently be described. In response to the START PULSE control signal, switch logic unit 56 generates a control signal (a logic "0" on conductor 88) to cause a synthesizer/AFT switch 48 to couple the output (conductor 122) of low pass filter and amplifier unit 46 to the control terminal of VCO 50 via a conductor 128 to form the phase locked loop configuration described above.

The START PULSE control signal also coupled to count preset logic to reset it prior to entry of new information from channel number register 28.

Channel number register 28, in addition to deriving the appropriate number N for programmable divider 34 and generating the START PULSE control signal, provides three band switching control signals (logic "1's"): a UHF control signal when a channel in the UHF range (e.g., channels 14-18) has been selected; a LOV control signal when a channel in the low VHF range, (e.g., channels 2-6) has been selected; and an HIV control signal when a channel in the high VHF range (e.g., channels 7-13) has been selected. The band switching control signals in conjunction with the SCAN ENABLE control signal are coupled to count preset logic 62 to cause it to select the appropriate number R.

These band switch control signals are also coupled in a suitable known manner (not shown) to voltage controlled tuning elements, such as varactor diodes, in VCO 50 and ÷R prescaler 52 to control the frequency of the input signal of ÷N 34 in accordance with which frequency band the selected channel is in.

The values of N and R for tuning the receiver to standard frequency carriers are shown in the columns labelled "N SCAN & NON-SCAN" and "R NON-SCAN" in the table of FIG. 6. The values in the table correspond to an implementation wherein the frequency of crystal oscillator 40 is 5 MHz and prescaler 52 divides the frequency of the output signal of voltage controlled oscillator (VCO) 50 by 256. It will be noted that the values of N are equal to the frequencies, in MHz, of the local oscillator output signals of VCO 50 required, when mixed with the respective received standard frequency carriers, to produce frequency difference IF signals having a picture carrier at 45.75 MHz (the standard IF picture carrier in most U.S. receivers):

Initially, when a channel has been selected by the viewer and programmable ÷N divider 34 and programmable ÷R divider 38 have been set, VCO 50 oscillates at an arbitrary frequency (e.g. at some midrange point in the selected band). The frequency of operation of VCO 50 is modified in response to the DC control signal output of low pass filter and amplifier unit 46 until the error output signal provided by phase detector 36 manifests that there is no phase or frequency difference between the output signals of programmable ÷N divider 34 and programmable ÷R divider 38. At this time, the phase locked loop corresponding to VCO 50, ÷K prescaler 52, programmable ÷N divider 34, phase detector 36, programmable ÷R divider 38, crystal oscillator 40 and low pass filter and amplifier unit 46 will provide a local oscillator signal at the output of VCO 50 having a frequency, $f_{LO}$, related to the frequency, $f_{XOSC}$, of the output signal of crystal oscillator 40 by the following expression:

$$f_{LO} = (NK/R) f_{XOSC} \qquad (1)$$

It should be noted that the output signal of low pass filter and amplifier unit 46 should have an amplitude range sufficient to vary the local oscillator signal over a frequency range, for a particular band, in excess of adjacent channel spacing and desirably large enough to allow tuning the receiver to all the channels in the particular band. Thus, for example, in the low VHF range, low pass filter and amplifier unit 46 may provide a control voltage in a range between first and second voltages sufficient to tune the receiver to either channel 2, 3, 4, 5, or 6.

The local oscillator output signal of VCO 50 is coupled to mixer 16 where it is combined in the conventional manner with the output signal of RF amplifier 14 to form an IF signal including a picture carrier at a frequency (e.g., 45.75 MHz) equal to the difference between the frequencies of the received carrier and the local oscillator signal. The IF signal is amplified by IF amplifier 18 and video information is extracted from it by video detector 20. The video signals are processed by signal processing unit 22 to form an image on the face of kinescope 24.

When the viewer elects to receive signals from a nonstandard carrier distribution system (e.g., via a CATV or MATV distribution system), the scan mode enable switch 54 is placed in the closed position thereby generating a SCAN ENABLE control signal (a logic "0") to place the tuning apparatus in the second or scanning mode of operation. In the second or scanning mode, during the reception of a nonstandard frequency carrier arbitrarily near (e.g., in the range of ±2 MHz) the frequency of an associated standard frequency carrier, programmable divide by N divider 34 is again set to a fixed value corresponding to the selected channel. However, ÷R divider 38 is initially set to a first value below the value corresponding to the associated standard frequency carrier (to which programmable ÷R divider 38 would have been set during the first mode) and then is incremented toward a second value above the value corresponding to the associated standard frequency carrier until tuning is achieved or until the second value is reached as will be explained in detail below.

In the scanning mode (as in the nonscanning mode) of operation, a viewer selects a channel by depressing the appropriate keys on channel selection keyboard 26 and in response, binary information representing the number N is entered in programmable divide by N divider 34. Furthermore, channel number register 28 also generates a START PULSE control signal (a logic "1") which is coupled to switch logic unit 56 to reset flip-flops 5612 and 5614. In response to the START PULSE control signal, switch logic unit 56 generates a control signal (a logic "0" on conductor 88) to cause synthesizer/AFT switch 48 initially to couple the output terminal of low pass filter and amplifier unit 46 to the control terminal of VCO 50. In addition, the START PULSE control signal also resets count preset logic unit 62 prior to entry of new data from channel number register 28. Also as in the nonscanning mode, channel number register 28 provides either a UHF, LOV or HIV control signal depending on which frequency band the selected channel is in.

In accordance with either the HIV or LOV control signals provided by channel number register 28 and the SCAN ENABLE control signal provided by switch 54, count preset logic unit 62 couples binary signals to up/down counter 42 representing the first preselected value below the value to which the number R would be set for the same channel selected during the nonscanning mode. The first preselected values corresponding to the various channels which are entered in up/down counter 42 during the scanning mode are indicated in the START R" column of the table of FIG. 6.

Count preset logic unit 62 also generates the compliments, $\overline{HIV}$ and $\overline{LOV}$, of the HIV and LOV control signals. These compliment signals are coupled to a scan stop logic unit 70 via a multiple conductor path 64 to set it to one of two preselected values (dependent on whether the selected channel is in the high or low VHF ranges) above the value to which the number R would be set in the nonscanning mode. The second preselected value corresponds to the highest value to which the number R could be incremented during the scanning mode. The second preselected values corresponding to the various channels are indicated in the "STOP R" column of the table of FIG. 6.

In response to the SCAN ENABLE control signal, switch logic unit 56 generates a $\overline{\text{SCAN STOP \#1}}$ control signal (a logic "1" indicating the absence or compliment of the SCAN STOP #1 control signal) to allow clock signals from divide by A divider 66 to reach the clock input of up/down counter 42. In response to these clocking signals, up/down counter 42 increments the number R from the first preselected value toward the second preselected value. The second preselected values corresponding to the various channels are indicated in the "R STOP" column of the table of FIG. 6.

The operation of the phase locked loop comprising VCO 50, ÷K prescaler 52, programmable ÷N divider 34, phase detector 36, crystal oscillator 40, programmable ÷R divider 38 and low pass filter and amplifier unit 46 operates as in the nonscanning mode to control the frequency, $f_{LO}$, of the local oscillator signal according to expression 1. However, as each successive clock pulse of the clock signal output of divide by A circuit 66 reaches up/down counter 42, the number R is successively incremented a predetermined amount as is indicated in the "Δ" column of the table of FIG. 6, the step sizes of R for the various channels when A is selected equal to 2 is 2. As a result, the frequency of the local oscillator signal is decremented (i.e. decreased in stepwise fashion). The starting and stopping frequencies of the local oscillator signals and the frequency step sizes for the various channels are indicated in the "$f_{LO}$ START," "$f_{LO}$ STOP" and "$\Delta f_{LO}$" columns of the table of FIG. 6 for an implementation wherein A is selected to be 2.

The local oscillator output signal of VCO 50, as in the nonscanning mode, is combined with the output signal of RF amplifier 14 in mixer 16 to provide a modulated IF signal whose carrier frequency is incremented in direct relationship in a range corresponding to the frequency range of the local oscillator signal. The scanning range for each channel is selected wide enough to include the frequency of the local oscillator signal required, when combined with the received nonstandard frequency carrier in mixer 16, to provide a modulated IF signal having a picture carrier at a predetermined frequency, e.g., 45.75 MHz.

Figure 4:
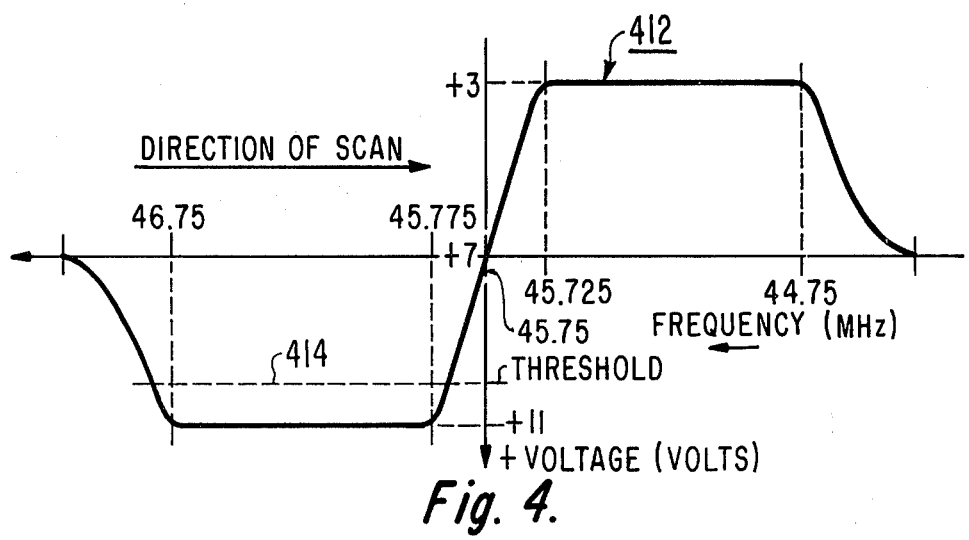
FIGS. 4 and 5 show graphical representations of voltage versus frequency characteristics associated with portions of the tuning apparatus shown in FIG. 1.

As the IF carrier is decremented, an automatic fine tuning (AFT) frequency discriminator unit 92 coupled to the output of IF amplifier 18 develops a voltage which is related to the frequency deviation between the frequency of the IF carrier and 45.75 MHz. FIG. 4 shows a graphic representation of an S-shaped voltage versus frequency characteristic 412 associated with AFT circuit 92 having typical values of voltage and frequency for the implementation shown in FIGS. 2 and 3. It is noted that the S-shaped characteristic 412 has an amplitude range between a minimum and a maximum amplitude corresponding to a frequency deviation (±25 kHz) which is a fraction of the frequency spacing between channels (6 MHz). The direction in which the frequency of the modulated IF carrier is scanned is also shnown in FIG. 4.

The output signal developed at a (+) output terminal of AFT circuit 92 is coupled to a threshold detector 82 via a conductor 104 where it is monitored. Threshold detector 82 generates a THRESHOLD control signal (a logic "1") when the voltage at the (+) output terminal of AFT circuit 92 rises above a predetermined threshold 414. The THRESHOLD control signal is coupled to switch logic unit 56 via a conductor 106 where it sets flip-flop 5612 of switch logic unit 56.

An AFT amplifier 94 amplifies the AFT signal developed at a (−) terminal of AFT circuit 92 and coupled to it via a conductor 124. The gain of AFT amplifier 94 is selected so that the amplified AFT signal has substantially the same amplitude range, between first and second voltages, as does the output signal of low pass filter and amplifier unit 46. That is, the amplitude range of the amplified output signal of AFT amplifier 94 should provide substantially the same voltage for a selected channel, when coupled to VCO 50, as does the output signal of low pass and amplifier unit 46. It is noted that the first and second voltages of the amplified AFT signal correspond to frequency deviations of the intermediate frequency carrier between the deviations associated with the maximum and minimum voltages of the frequency discriminator characteristic associated with AFT circuit 92.

Figure 5:
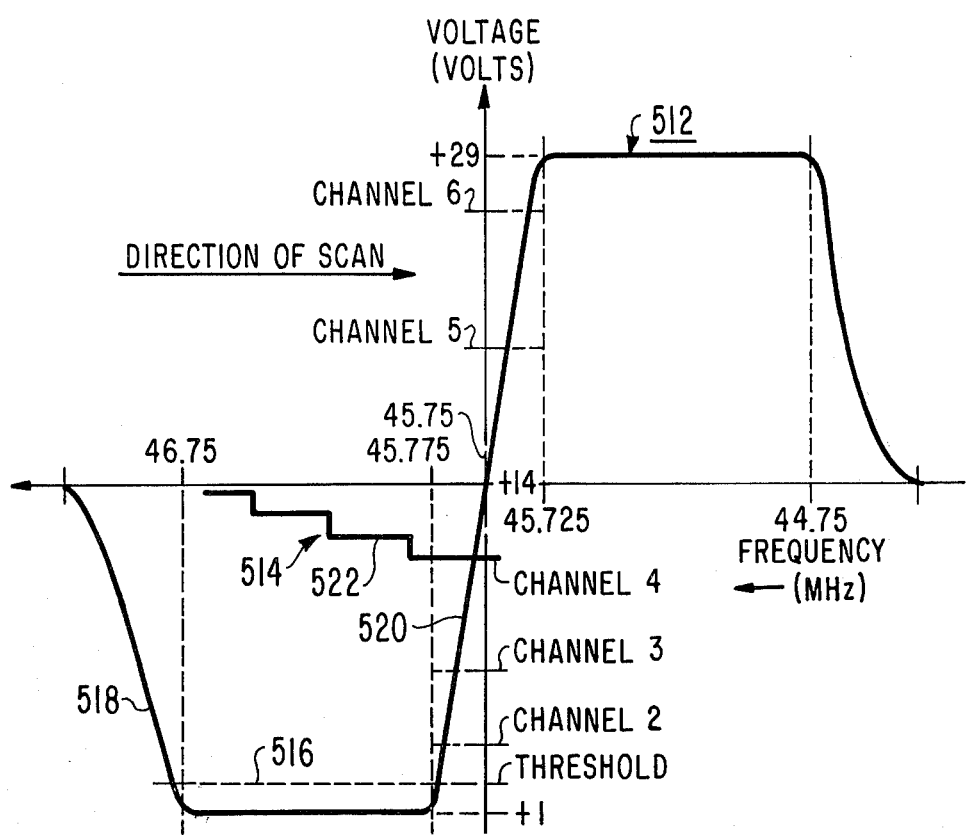

A graphic representation of the voltage versus frequency characteristics 512 of an amplified AFT output signal of AFT amplifier 94 is shown in FIG. 5 having typical values of voltage and frequency for the implementations shown in FIGS. 2 and 3. The direction in which the frequency of the modulated IF carrier is scanned is also shown. Also indicated are the approximate levels of the control voltages supplied to VCO 50 corresponding to the channels in the low VHF frequency range. It will be appreciated that a similar characteristic is associated with the channels in the high VHF range. Also shown in FIG. 5 is a partial graphic representation of a step shaped waveform 514 similar to that of the output signal of low pass filter and amplifier 46 which causes the frequency of the modulated IF carrier to be incremented.

A comparator 84 compares the output signal of low pass filter and amplifier unit 46 (waveform 514) coupled to it via a conductor 100, with the output signal of AFT amplifier 94 (waveform 512), coupled to it via a conductor 58, and generates a COMPARISON control signal (a logic "1") when their voltages are equal. The COMPARISON control signal is coupled to switch logic unit 56 via a conductor 102 and sets flip-flop 5614 of switch logic unit 56.

When flip-flop 5612 is set in response to the THRESHOLD control signal and flip-flop 5614 is set in response to the COMPARISON control signal, switch logic unit 56 generates a control signal (a logic "1" on conductor 88) to decouple the output terminal of low pass filter and amplifier unit 46 from the control terminal of VCO 50 and couple the output terminal of AFT amplifier 94 to the control terminal of VCO 50 instead. Thereafter the amplified AFT signal controls the frequency of the local oscillator signal output of VCO 50.

If the frequency of the local oscillator signal drifts, because of temperature changes or component value changes or the like, from the frequency established at the time the control input signal to VCO 50 is switched from the output signal of low pass filter and amplifier unit 46 to the amplified AFT signal, AFT signal 92 operates in a negative feedback manner to provide an amplified AFT signal to oppose the frequency change due to the drift.

The THRESHOLD control signal indicates that the amplified AFT signal is changing in the right direction to provide AFT control. Threshold 414 in FIG. 4 corresponds to threshold 516 in FIG. 5. If switch 48 were to couple amplified AFT signals from AFT circuit 92 to VCO 50 before the amplified AFT reached threshold 516, AFT control would not be achieved as the control voltage supplied to VCO 50 would be changing in the wrong direction, i.e., along sloped portion 518 of characteristic 512 rather than along sloped portion 520.

The COMPARISON control signal indicates that the amplified AFT signal is providing a control voltage, which when coupled to VCO 50, causes VCO 50 to generate a local oscillator signal having a frequency sufficiently close to the frequency of the local oscillator signal associated with the selected channel. For example, assuming that channel 4 were the selected channel, then if switch 48 were switched to couple the output terminal of AFT amplifier 94 to the control input terminal of VCO 50 when the voltage from low pass filter 46 were at level 522, the control voltage that would be applied to VCO 50 would correspond to a channel near channel 2 rather than to the control voltage required for channel 4.

Thus, VCO 50 control is switched from phase locked loop control to AFT control when both the THRESHOLD and COMPARISON control signals are present. In addition, when the THRESHOLD and COMPARISON control signals have been generated, switch logic unit 56 generates a STOP SCAN #1 control signal (a logic "0" on conductor 90) to prevent clock signals from reaching the clock input of up/down counter 42 to prevent the further incrementing of programmable divide by R divider 38 and therefore end the scanning operation.

If no AFT control is achieved before the number R reaches its final value, (bR STOP" of the table of FIG. 6), scan stop logic unit 70 generates a SCAN STOP #2 control signal (a logic "0" on conductor 108) to prevent clock signals from reaching the clock input of up/down counter 42 to end the scanning. At this point, the viewer will see a picture of poor quality and may select another channel or initiate a new scanning interval by selecting another channel and then reselecting the originally selected channel.

It is noted that the frequency of the modulated IF carrier is decremented by decrementing the frequency of the local oscillator signal. This is desirable so that the first carrier to be reached will be the desired picture carrier rather than an adjacent channel sound carrier. This avoids or minimizes erroneous tuning.

It should be noted, that if a UHF control signal has been generated by channel number register 28, even though scan mode enable switch 54 has been closed to enable tuning the receiver to nonstandard frequency carriers, switch logic unit 56 will, in response to the UHF control signal, generate a SCAN STOP #1 control signal to prevent clock signals from ÷A divider 66 from reaching the clock input of up/down counter 42 via clock enable unit 68. Therefore, the number R in programmable ÷R divider 38 will not be incremented when a UHF channel has been selected whether scan mode enable switch has been depressed or not. This arrangement is provided since most television distribution systems do not reconvert the frequencies of UHF carriers for distribution at other UHF frequencies and therefore the scanning mode of operation is not required when a UHF channel is selected. However, it should be appreciated that the tuning apparatus could be modified to scan for nonstandard frequency UHF carriers.

Although no detailed descriptions of the implementations shown in FIGS. 2 and 3 have been given for the reasons mentioned before, it is noted that with respect to the logic implementations shown in FIG. 2, that the CD4027 integrated circuit included as part of programmable ÷R divider 38 is a flip-flop which divides the frequency of the output signal of the CD4059 integrated circuit counter, also included in divider 38, by 2. As a result, the numbers set in the CD4029 integrated circuit counters forming up/down counter 42 are only one half of the corresponding values of R shown in the table of FIG. 6. Furthermore, only the binary signals representing "1", "2", and "4" for forming the most significant digit (MSD), corresponding to the ten's digit position, and the least significant digit (LSD), corresponding to the unit's digit position, of the numbers corresponding to the values of "STOP R" are coupled to scan stop logic unit 70 because the MSD and LSD of the numbers corresponding to R STOP do not require "8" for their formation. In addition, the binary signals for forming the hundred's digit of the numbers provided by up/down counter 42 are not coupled to scan stop logic unit 70 because the number in the hundred's digit is the same for both the low VHF and high VHF ranges and is not incremented.

While with reference to FIG. 1 the frequency decrementing of the modulated IF carrier has been provided by incrementing programmable ÷R divider 38, it should be appreciated with the frequency of the IF carrier may alternatingly be decremented by decrementing the value entered in programmable ÷N divider 34 as is indicated by a multiple conductor path 126 coupled between up/down counter 42 and programmable ÷N divider 34. Furthermore, while the tuning apparatus of FIG. 1 has been described as decrementing the frequency of the IF carrier so as to avoid tuning the receiver to the adjacent channel's sound carrier, it will be appreciated that the frequency of the IF carrier may be incremented. These and other modifications of the invention are considered to be within the scope of the present invention and the embodiments shown in FIGS. 1, 2 and 3 are not to be construed as limiting the scope of the present invention.

What is claimed is:

1. In a television receiver, tuning apparatus comprising:
controlled oscillator means for generating a local oscillator signal;
mixer means for combining said local oscillator signal and a modulated received carrier to derive a modulated intermediate frequency carrier;
first programmable divider means for dividing the frequency of said local oscillator signal by a first number corresponding to a selected channel to provide a frequency divided local oscillator signal;
channel selection means for selecting said first number;
means for providing a reference frequency signal;
phase detector means for providing a first control signal for maintaining said frequency divided local oscillator signal and said reference frequency signal in predetermined phase and frequency relationship, said first control signal having an amplitude range between first and second amplitudes sufficient to vary said local oscillator signal over a frequency range in excess of adjacent channel spacing;
frequency discriminator means for generating a discriminator signal representing the frequency deviation of said intermediate frequency carrier from a fixed frequency, said discriminator signal having an amplitude range between maximum and minimum amplitudes corresponding to frequency deviations which are fractions of the frequency spacing between channels;

means coupled to said discriminator means for deriving a second control signal having an amplitude range between first and second amplitudes which are substantially the same as the first and second amplitudes of said first control signal, said first and second amplitudes of said second control signal corresponding to frequency deviations of said intermediate frequency carrier from said fixed frequency between the deviations associated with said maximum and minimum amplitudes;

scanning means for causing said local oscillator signals to be scanned in a predetermined scanning range in the vicinity of the local oscillator signal corresponding to the selected channel;

means for disabling said scanning means when the deviation between the frequency of said intermediate frequency carrier and said fixed frequency is within a predetermined control range and when the amplitude of said second control signal substantially equals the amplitude of said first control signal corresponding to the selected channel; and switching means for selectively coupling said first and second control signals to said controlled oscillator means, said switching means being responsive to disabling of said scanning means to decouple said first control signal from said controlled oscillator means and to couple said second control signal to said controlled oscillator means.

2. The apparatus recited in claim 1 wherein said scanning means causes said local oscillator to be scanned in a predetermined scanning range wide enough to include a local oscillator signal having a frequency corresponding to a nonstandard frequency carrier associated with a standard frequency carrier allocated to the selected channel.

3. The tuning apparatus recited in claim 1 wherein said scanning means includes means for changing in steps the frequency of said divided local oscillator signal relative to said reference frequency signal.

4. The tuning apparatus recited in claim 3 wherein said scanning means includes counter means coupled to said first programmable divider means for changing in steps said first number.

5. The tuning apparatus recited in claim 3 wherein said means for providing a reference frequency signal includes means for providing a stable frequency signal and second programmable counter means for dividing the frequency of said stable frequency signal and second programmable counter means for dividing the frequency of said stable frequency signal by a second number, said channel selection means also deriving said second number in accordance with the presently selected channel; and said scanning means includes counter means for changing in steps said second number.

6. The tuning apparatus recited in claim 5 wherein said scanning means includes means for generating a scan enable signal indicating the reception of a nonstandard frequency carrier located arbitrarily near the standard frequency carrier allocated to the selected channel, said predetermined scanning range being wide enough to include the local oscillator frequency corresponding to said nonstandard frequency carrier.

7. The tuning apparatus recited in claim 6 wherein said channel selection means is responsive to said scan enable signal; said channel selection means in the presence of said scan enable signal sets said second number to a first predetermined value; said counter means changes in steps said second number from said first predetermined value to a third predetermined value in response to said scan enable signal; and said channel selection means in the absence of said scan enable signal sets said number to a third predetermined number, said third predetermined value being between said first and second predetermined values.

8. The tuning apparatus recited in claim 7 wherein said channel selection means sets said first predetermined value lower than said second predetermined value.

9. The tuning apparatus recited in claim 7 wherein said channel selection means selects a first set of first, second and third predetermined values when the carrier associated with the selected channel is in a lower portion of the very high frequency range and a second set of first, second and third predetermined values when the carrier associated with the selected channel is in a higher portion of the very high frequency range.

10. The tuning apparatus recited in claim 1 wherein said scan means causes the local oscillator signal to be scanned from a frequency higher than the frequency of the local oscillator signal associated with the presently selected channel.

11. The tuning apparatus recited in claim 2 wherein said scanning means includes means for inhibiting scanning when a standard frequency carrier is being received.

12. The tuning apparatus recited in claim 11 wherein said means for inhibiting scanning includes a manually operable switch.

13. The tuning apparatus recited in claim 11 wherein said channel selection means derives a UHF control signal when the carrier associated with a selected channel is in the ultra high frequency range, said UHF control signal being coupled to said scanning means to inhibit scanning.

14. The tuning apparatus recited in claim 1 wherein said controlled oscillator means includes a voltage controlled oscillator; said second control signal is a signal having a generally S-shaped voltage versus frequency characteristic having an approximate symmetry point substantially at said fixed frequency; and wherein said means for disabling said scanning means includes means for detecting when said second control signal has a voltage which is changing in a direction toward said symmetry point and generating in response thereto a threshold signal indicating that the frequency deviation between the frequency of said intermediate frequency carrier and said fixed frequency is with said predetermined control range.

15. The tuning apparatus recited in claim 14 wherein said means for detecting when said second control signal has a voltage which is changing in a direction toward said symmetry point includes threshold detecting means for detecting when said second control signal has traversed a first predetermined threshold on said voltage versus frequency characteristic associated with second control signal.

16. The tuning apparatus recited in claim 15 wherein said discriminator signal has a voltage versus frequency characteristic corresponding to said voltage versus frequency characteristic associated with said second control signal; and said threshold detecting means detects when said discriminator signal has traversed a second predetermined threshold on said voltage versus frequency characteristic corresponding to said first predetermined threshold.

17. The tuning apparatus recited in claim 14 wherein said first control signal has a voltage versus frequency characteristic; and wherein means for disabling said scanning means signal includes means for comparing the voltages of said first and second control signal and generating a comparison signal when said voltages of said first and second control signals are substantially the same.

18. The tuning apparatus recited in claim 17 wherein said means for disabling said scanning means includes first flip-flop means for generating a set signal in response to said threshold signal and second flip-flop means for generating said signal in response to said comparison signal and said set signal.

19. Apparatus for tuning a receiver to a radio frequency carrier associated with a tuning position, said radio frequency carrier having either a standard frequency or a nonstandard frequency arbitrarily near said standard frequency, comprising:
controlled oscillator means for generating a local oscillator signal;
a source of a relatively stable frequency signal;
controllable counter means for counting in response to at least one of said local oscillator signal and said stable frequency signal to establish a predetermined proportional frequency relationship between said local oscillator signal and said stable frequency signal;
first control means coupled between said counter means and said controlled oscillator means for controlling the frequency of said local oscillator signal in accordance with said predetermined proportional frequency relationship;
mixer means for combining said radio frequency carrier and said local oscillator signal to generate an intermediate frequency signal having at least one information bearing carrier, the frequency of said information bearing carrier having a standard value;
counter control means coupled to said controllable counter for determining a controllable factor by which the frequencies of said local oscillator signal and said stable frequency signal are proportional, said controllable factor having a nominal value associated with said standard frequency of said radio frequency carrier; and
second control means for offsetting said controllable factor from said nominal value by an amount within a predetermined range determined by the expected deviation between said nonstandard frequency and said standard frequency and thereafter controlling the frequency of said local oscillator signal to reduce a deviation between the frequency of said information bearing carrier and said standard value.

20. The apparatus recited in claim 19 wherein said first means generates a first control signal for controlling the frequency of said local oscillator signal;
said second control means includes discriminator means for generating a second control signal representing the frequency deviation between said intermediate frequency signal and said standard value for controlling the frequency of said local oscillator signal; and
said second means includes switching means for initially coupling said first control signal to said controlled oscillator means and thereafter coupling said second control signal to said controlled oscillator means.

21. The apparatus recited in claim 20 wherein said discriminator means has a predetermined frequency control range; and
said switching means couples said second control signal to said controlled oscillator means when the deviation between the frequency of said information bearing carrier and said standard value is within said predetermined frequency control range of said discriminator.

22. The apparatus recited in claim 21 wherein said counter control means is responsive to predetermined conditions of said second control signal to change said controllable factor to reduce the deviation between the frequency of said information bearing carrier and said standard value.

23. The apparatus recited in claim 22 wherein said controllable counter means includes a first and second programmable counter, said first programmable counter being coupled between said controlled oscillator means and said first control means to divide the frequency by a first controllable factor to generate a frequency divided local oscillator signal, said second programmable counter is coupled between said source of stable frequency signal and said first control means to divide the frequency of said stable frequency signal by a second controllable factor to generate a reference frequency signal;
said counter control means includes tuning position selection means for controlling said first programmable factor in accordance with said selected channel; and
said first control means includes phase detector means for generating said first control signal in response to the frequency deviation between said frequency divided local oscillator signal and said reference frequency signal.

24. The apparatus recited in claim 23 wherein said first programmable counter is responsive to predetermined conditions of said second control signal.

25. The apparatus recited in claim 23 wherein said second programmable counter is responsive to predetermined conditions of said second control signal.

26. The apparatus recited in claim 19 wherein said second control means initially offsets said controllable factor from said nominal value so that the frequency of said information bearing carrier is offset to a value higher than said standard value.

27. A tuning system for a tuner of a television receiver capable of receiving a composite television signal and including automatic fine tuning (AFT) circuit means producing an AFT signal, said system including in combination:
reference oscillator means providing a reference signal at a predetermined frequency;
local oscillator means in the tuner providing a variable output frequency in response to the application of a control signal thereto;

a programmable frequency divider having an input coupled to the output of said reference oscillator means for producing an output signal having a frequency which is a programmable fraction of the frequency of the signal applied to the input thereto from said reference oscillator means;

means coupled with the output of said programmable frequency divider and the output of said local oscillator means for developing a control signal and applying such control signal to said local oscillator means for controlling the frequency of operation thereof; and control means coupled with the output of the AFT circuit means and further coupled with said programmable frequency divider for controlling said frequency divider to change said programmable fraction in response to predetermined signal conditions of the AFT signal.

28. A tuning system for a tuner of a television receiver capable of receiving composite television signals corresponding to respective channels, each of said composite television signals having either a standard frequency carrier or a nonstandard frequency carrier, said nonstandard frequency carrier being arbitrarily near said standard frequency carrier within a first predetermined range less than the frequency separation between said channels and including automatic fine tuning (AFT) circuit means producing an AFT signal, said system including in combination:

reference oscillator means providing a reference signal at a predetermined frequency;

local oscillator means in the tuner providing a variable output frequency in response to the application of a control signal thereto;

a programmable frequency divider having an input coupled to the output of one of said reference oscillator means and said local oscillator means for producing an output signal having a frequency which is a programmable fraction of the frequency of the signal applied to the input thereto;

means coupled with the output of said programmable frequency divider and the output of said other one of said reference oscillator means and said local oscillator means for developing a control signal and applying such control signal to said local oscillator means for controlling the frequency of operation thereof; and control means coupled with the output of the AFT circuit means and further coupled with said programmable frequency divider for controlling said frequency divider to change said programmable fraction within a second predetermined range determined by said first predetermined range in response to predetermined signal conditions of the AFT signal.

29. A tuning system for receiving composite RF television signals associated with respective channels, each of said composite RF signals having either a standard frequency carrier or a nonstandard frequency carrier, each of said nonstandard frequency carriers being arbitrarily near a respective one of said standard frequency carriers within a first predetermined range less than the frequency separation between adjacent ones of said channels, comprising:

local oscillator means for generating a local oscillator signal having a frequency controlled in response to a control signal;

first programmable divider means for dividing the frequency of said local oscillator signal by a first programmable factor to generate a first frequency-divided signal;

a source of a relatively stable frequency signal having a substantially lower frequency than said local oscillator signal;

a second programmable divider for dividing the frequency of said stable frequency signal by a second programmable factor to generate a second frequency-divided signal;

phase comparator means for generating said control signal for said local oscillator means in response to at least one of the phase and frequency deviation between said first frequency-divided signal and said second frequency-divided signal;

mixer means for combining said RF signals and said local oscillator signal to generate an IF signal including at least one information bearing carrier;

first control means for controlling said first programmable factor to select one of said channels; and second control means for controlling the second programmable factor to control the frequency of said information bearing carrier within a second predetermined range determined by said first predetermined range.

* * * * *